United States Patent [19]
Shin et al.

[11] Patent Number: 4,733,105
[45] Date of Patent: Mar. 22, 1988

[54] CMOS OUTPUT CIRCUIT

[75] Inventors: Yasuhiro Shin; Kazuhiko Yamada, both of Tokyo, Japan

[73] Assignee: Oki Electric Industry Co., Ltd., Tokyo, Japan

[21] Appl. No.: 900,810

[22] Filed: Aug. 27, 1986

[30] Foreign Application Priority Data

Sep. 4, 1985 [JP] Japan ................................ 60-195530

[51] Int. Cl.⁴ .............................................. H03K 5/01
[52] U.S. Cl. .................................... 307/261; 307/264; 307/243; 307/585
[58] Field of Search ............... 307/261, 264, 243, 584, 307/585

[56] References Cited

U.S. PATENT DOCUMENTS 3,995,177 11/1976 Sirocka et al. ...................... 307/264
4,324,991 4/1982 Tamaki ................................ 307/579

Primary Examiner—John Zazworsky
Attorney, Agent, or Firm—Wenderoth, Lind & Ponack

[57] ABSTRACT

A CMOS output circuit including CMOS inverters, is formed on a semiconductor substrate and N MOS switching transistors are provided. The output circuit is responsive to an external control signal for switching a plurality of reference voltages and delivering them as multiple-level drive signals. The CMOS output circuit furthermore includes PMOS switching circuits connected in parallel with each of a plurality of CMOS transfer gates, CMOS inverters, and N MOS switching transistors for preventing a latch-up phenomenon of the CMOS inverters from being produced. The PMOS switching circuits are on-off controlled by a control signal obtained by converting an amplitude level of an external control signal.

9 Claims, 15 Drawing Figures

(MULTI-POWER
SOURCE CIRCUIT)

CMOS OUTPUT CIRCUIT

BACKGROUND OF THE INVENTION

1. Field of the Invention

The present invention relates to a CMOS output circuit, and more particularly to a dynamic CMOS output circuit with transfer gates.

2. Description of the Prior Art

A CMOS output circuit for providing a multi-level drive signal based on a control signal is formed in general on a silicon substrate and is profitably employed as a display drive circuit for driving a liquid crystal display (LCD) panel.

Recently, liquid crystal display (LCD) panels have been widely employed as a low power consumption display device for electronic equipment. The LCD display panel includes a plurality of display elements, each of which has a liquid crystal layer sandwiched between two electrodes which responds to a drive voltage applied between the two electrodes to vary its molecular orientation. The molecular orientation controls the scattering or transmission of light impinging upon the liquid crystal layer. LCD panels are generally operated by AC drive signals to prevent the degradation of its liquid crystal material.

For example, in the operation of a LCD panel which includes a plurality of X and Y electrodes in a matrix form and liquid crystal layers between the X and Y electrodes, a CMOS output circuit has been used for providing drive signals of multi-levels (for example, +5 V, +3 V, +1 V, −1 V) to the X and Y electrodes of the LCD panel by selectively controlling different reference voltages.

However, a prior art CMOS output circuit has the following disadvantages.

If the voltage difference between the maximum reference voltage and a minimum reference voltage of a plurality of reference voltages becomes greater than a predetermined value, (for example, more than 14 V), the CMOS inverters and transfer gates in the CMOS output circuit may be latched up, so that an uncontrolled large current flows through the CMOS inverters and transfer gates. It would be impossible to stop the uncontrolled current in such a condition without removing an external power supply voltage.

In particular, since a large sized LCD panel requires a high voltage signal as a driving signal to obviate the degradation of the screen contrast, it is very important to solve the latching problem.

Also, if a voltage difference between the maximum and minimum voltages of a plurality of reference voltages becomes extremely low (for example, less than a threshold voltage $V_T$), the CMOS output circuit cannot provide enough drive current to the LCD panel. In order to improve the current supplying capability of the CMOS output circuit, the use of a large MOS transistor will result in the increase of the IC chip area.

Meanwhile, there has been another strong desire to provide a CMOS output circuit which can operate with a lower power supply voltage (for example, about 5 volts) without decreasing its current supplying capability to the LCD panel.

In order to overcome the two disadvantages noted above, there is a need for a CMOS output circuit which can operate over a wide range of power supply voltages.

SUMMARY OF THE INVENTION

In view of the drawbacks of prior drive signal output circuits, it is an object of the present invention to provide a CMOS output circuit device capable of generating a low voltage level drive output signal with sufficient current supply capability.

Another object of the present invention is to provide a CMOS output circuit capable of securely operating over a wide operation range of a power source.

Still another object of the present invention is to provide a CMOS output circuit capable of operating in a high-voltage operation region of a power source without causing a latch-up phenomenon.

A still further object of the present invention is to provide a CMOS output circuit capable of reducing an IC chip area of an LCD drive device.

The abovenoted object may be effected by providing a CMOS output circuit formed on a semiconductor substrate comprising:

(a) a control signal level shifting circuit responsive to a plurality of external control signals for delivering a plurality of control signals respectively converted to different amplitude levels;

(b) a first switch means responsive to one of said control signals from said control signal level shifting circuit for selectively delivering a first reference voltage;

(c) a second switch means responsive to one of said control signals from said control signal level shifting circuit for delivering a second reference voltage;

(d) a third switch means responsive to one of said control signals from said control signal level shifting circuit for delivering a third reference voltage;

(e) a fourth switch means responsive to one of said control signals from said control signal level shifting circuit for selectively delivering a fourth reference voltage;

(f) a fifth switch means for selectively delivering one of said first, second, third, and fourth reference voltages to an output terminal based on one of said control signals from said control signal level shifting circuit;

(g) a sixth switch means, connected in parallel with said first switch means, responsive to one of said external control signals for selectively delivering said first reference voltage;

(h) a seventh switch means, connected in parallel with said second switch means, responsive to one of said external control signals for selectively delivering said second reference voltage;

(i) an eighth switch means, connected in parallel with said third switch means, responsive to one of said external control signals for selectively delivering said third reference voltages;

(j) a ninth switch means, connected in parallel to said fourth switch means, responsive to one of said external control signals for selectively delivering said fourth reference voltage;

(k) a tenth switch means, connected between output nodes of said first and third switch means, and said output terminal, responsive to one of said external control signals for delivering said first or third reference voltage to said output terminal; and (l) an eleventh switch means, connected between outputs of said second and fourth switch means, and said output terminal, responsive to one of said external control signals for delivering said second or fourth reference voltage to said output terminal.

The abovenoted object may also be effected by providing a CMOS output circuit formed on a semiconductor substrate comprising:

(a) a multi-power source circuit for generating first, second, third, and fourth reference voltages;

(b) a control signal level shifting circuit for converting a plurality of external control signals to control signals shifted to different amplitude levels;

(c) complementary MOS switch means connected between first and second signal input nodes and on-off controlled by one of said control signals from said control signal level shifting circuit for selectively delivering a reference voltage at said first or second signal input node to a signal output terminal;

(d) a first MOS switch means, connected between said first reference voltage and said first signal input node of said complementary switch means for selectively delivering said first reference voltage to said first signal node based on one of said control signals from said control signal level shifting circuit;

(e) a second MOS switch means, connected between said second reference voltage and said first signal input node of said complementary MOS switch for selectively delivering said second reference voltage to said first signal node based on one of said control signals from said control signal level shifting circuit;

(f) a third MOS switch means connected between said third reference voltage and said second signal node of said complementary MOS switch means for selectively delivering said third reference voltage to said second signal node based on one of said control signals from said control signal level shifting circuit;

(g) a fourth MOS switch means connected between said fourth reference voltage and said second signal node of said complementary MOS switch means for selectively delivering said fourth reference voltage to said second node based on one of said control signals from said control signal level shifting circuit;

(h) a fifth MOS switch means connected between said first reference voltage and said first signal input node for selectively delivering said first reference voltage to said first node based on one of said external control signals;

(i) a sixth MOS switch means connected between said third reference voltage and said second signal input node for selectively delivering said third reference voltage to said second node based on one of said external control signals;

(j) a seventh MOS switch means connected between said first signal input node and said signal output terminal for selectively delivering a reference voltage at said first signal input node to said output terminal based on one of said external control signals;

(k) an eighth MOS switch means connected between said second signal input node and said signal output terminal for selectively delivering a reference voltage at said second signal input node to said output terminal based on one of said external control signals; and (l) a ninth MOS switch means connected between said fourth reference voltage and said second signal input node for selectively delivering said fourth reference voltage to said second signal input node based on one of said external control signal.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENT

An embodiment of a CMOS output circuit suitable for an LCD drive device according to the present invention will be described with reference to FIG. 1.

The CMOS output circuit is formed on an N type silicon substrate for example.

Figure 1:
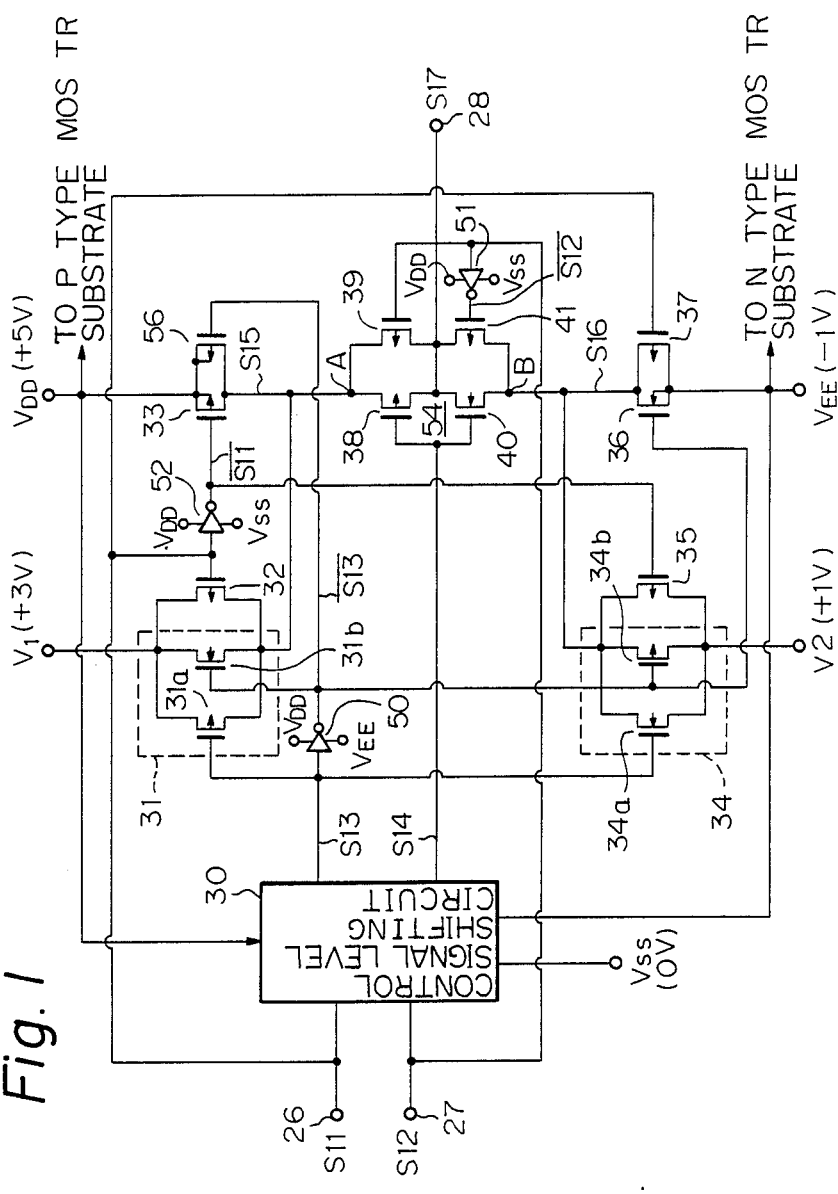
FIG. 1 is a circuit block diagram illustrating a first embodiment of a CMOS output circuit according to the present invention.

As shown in FIG. 1, the CMOS output circuit consists of a level shifting circuit 30 for converting control signals $S_{11}$ and $S_{12}$, having an amplitude which is equal to the potential difference $|VDD-VSS|$ between reference voltages VDD (+5 V) and VSS (0 V), to control signals $S_{13}$ and $S_{14}$, having an amplitude which is equal to the potential difference $|VDD-VEE|$ between the reference voltage VDD and a reference voltage VEE ($-1$ V), and a transfer switch 31 responsive to the shifting control signals $S_{13}$, $\overline{S_{13}}$ and for transmitting the reference voltage $V_1$ (+3 V), and a CMOS transfer switch 34 responsive to the control signal voltages $S_{13}$ and $\overline{S_{13}}$ for transmitting reference voltage $V_2$ (+1 V).

The CMOS output circuit furthermore consists of a CMOS inverter 54 controlled by the control signal $S_{14}$, a PMOS transistor 56 controlled by the control signal $\overline{S_{13}}$ from an inverter 50 for transmitting the reference voltage VDD (+5 V) to a CMOS inverter 54, and an N MOS transistor 36 controlled by the control signal $\overline{S_{13}}$ for transmitting the reference voltage VEE ($-1$ V) to the CMOS inverter 54.

Moreover, the CMOS output circuit according to the present invention includes:

a PMOS transistor 32 connected in parallel to the transfer switch 31 and controlled by the control signal S11;

a PMOS transistor 35 connected in parallel to the transfer switch 34 and controlled by the control signal $\overline{S11}$ from the inverter 52;

a PMOS transistor 33 connected in parallel to the MOS transistor 56 and controlled by the control signal $\overline{S11}$; and a PMOS transistor 37 connected in parallel to the MOS transistor 36 and controlled by the control signal $\overline{S11}$.

The CMOS inverter 54 in the CMOS output circuit consists of a PMOS transistor 38 and an N MOS transistor 40 connected in series; the inverter 54 is responsive to the control signal S14 for delivering a selected reference voltage to an output terminal 28.

The output terminal 28 of the CMOS inverter is connected to one electrode of the LCD element.

A PMOS transistor 39 is connected in parallel to the PMOS transistor 38 of the CMOS inverter 54 and controlled by the control signal S12.

A PMOS transistor 41 is connected in parallel to the N MOS transistor 40 of the CMOS inverter 54 and controlled by the control signal $\overline{S12}$ from an inverter 51.

The CMOS output circuit of the present invention is formed on an N type silicon substrate, for example, and is adapted to have a P well region forming the N MOS transistor thereof connected to the reference voltage VEE or VSS. The N type silicon substrate forming the PMOS transistors of the CMOS output circuit is connected to the reference voltage VDD.

Figure 3:
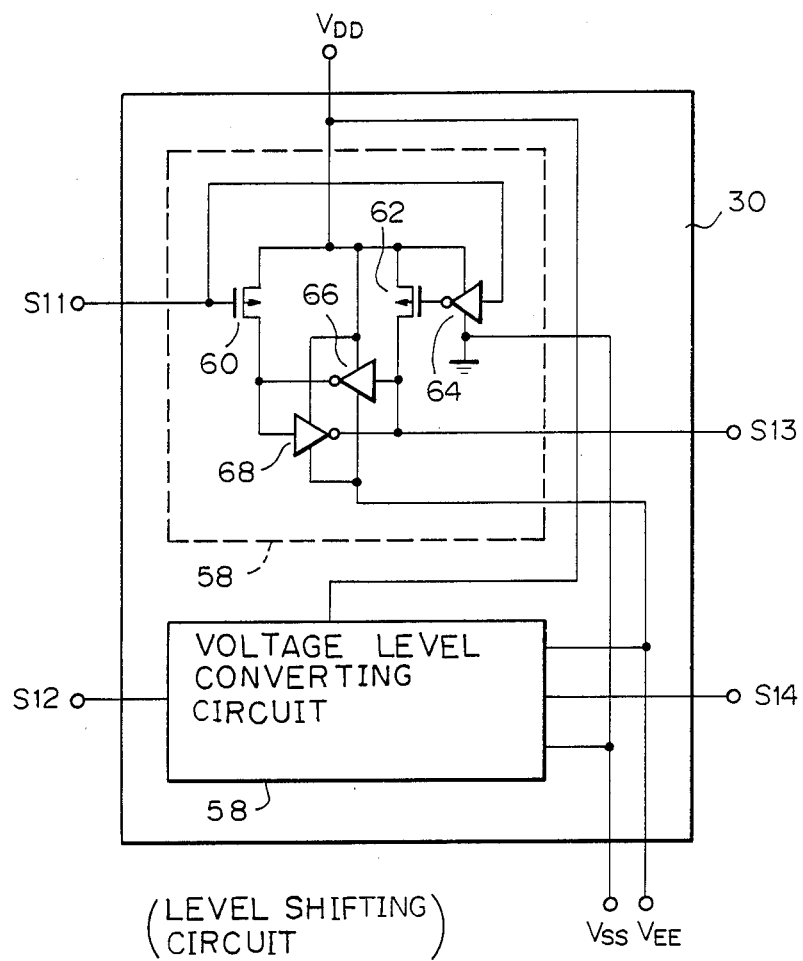
FIG. 3 is a detailed diagram of a level shifting circuit for level-shifting a control signal in the first embodiment of FIG. 1.

The level shifting circuit 30 includes, as shown, for example, in FIG. 3, a plurality of voltage level converting circuits 58, each constructed with PMOS transistors 60 and 62 and CMOS inverters 64, 66, and 68, and serves to shift the L level of the input control signals S11 and S12 to VEE.

Hereupon, the inverter 64 has source voltages of VDD (+5 V) and VSS (0 V) supplied thereto, while the inverters 66 and 68 have source voltages of VDD and VEE (−1 V) supplied thereto.

Figure 4:
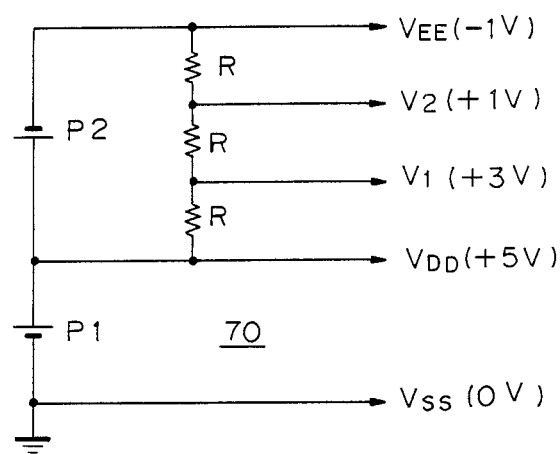
FIG. 4 is a circuit block diagram illustrating a multi-power source circuit for use in the embodiment of FIG. 1, and FIG. 5, consisting of FIGS. 5A and 5B is a circuit block diagram illustrating a second embodiment of a CMOS output circuit according to the present invention.

The multiple power supply circuit 70, as shown in FIG. 4, comprises a voltage dividing circuit which includes direct current power supplies P1 and P2 and a plurality of resistors R and provides reference voltages VEE (−1 V), V1 (+3 V), V2 (+1 V), VDD (+5 V) and Vss (0 V).

Moreover, the inverters 51 and 52 have source voltages of VDD and VSS supplied thereto while the inverter 50 has source voltages VDD and VEE supplied thereto.

In succession, the operation of the CMOS output circuit for driving an LCD as shown in FIG. 1, will be described with reference to the signal waveforms of FIGS. 2(a)-2(j).

The level shifting circuit 30 receives the control signals S11 and S12 supplied to input terminals 26 and 27, as shown in FIGS. 2(a) and 2(c).

The "H" level of the control signals S11 and S12 is assumed here to be VDD (+5 V) while the "L" level thereof is assured to be VSS (0 V).

With the control signals S11 and S12 being at the "L" level in the interval T11 as shown in FIGS. 2(e) and 2(g), the level shifting circuit 30 delivers the control signals S13 and S14 shifted by 1 volt (VEE) in the negative direction.

The transfer switch 31 and the N MOS and P MOS transistors 36 and 37 are switched on by the control signals S11, S13, and $\overline{S13}$. In addition and the P MOS transistors 38, 39 are switched on by the control signals S14 and S12 while the PMOS transistor 32 is switched on by the control signal S11.

Moreover, the transfer switch 34 is switched off by the control signals 213, and $\overline{S13}$, while the PMOS transistors 33 and 56 are switched off by the control signals $\overline{S11}$ and $\overline{S13}$. Furthermore, the N and PMOS transistors 40 and 41 are switched off by the control signals S14 and $\overline{S12}$, while the PMOS transistors 35 is switched off by the control signal $\overline{S11}$.

Accordingly, the reference V1 (+3 V) appears on the output terminal 28 (refer to FIG. 2(j)).

VEE is supplied to a substrate for an NMOS transistor having a threshold voltage of 0.7 V, while VDD is supplied to N well regions in the substrate for the PMOS transistors, each of which has a threshold voltage of 0.7 V. The PMOS transistors 32 and 39 are switched off, provided that a voltage difference between the reference voltages VDD and VEE ranges from 12.9 to 14 V. Thus, the gates of the PMOS transistors 31a and 38 are at −8.6 through −9.6 V with respect to sources thereof, and a gate of the MOS transistor 31b is at a voltage which becomes +4.3 through +4.7 V with respect to the source thereof, whereby the PMOS transistors 31a and 38 are placed in their on-state, so as to supply a sufficient drive current to the LCD element.

In addition, with the voltage difference between VDD and VEE ranging from 6 to 12.9 V, the gate voltages of the PMOS transistors 32 and 39 range from −3 to the −0.7 V with respect to sources thereof, and the gate voltages of the PMOS transistors 31a and 38 range from −4 to −8.6 V with respect to their sources, and the gate voltage of the N MOS transistor 31b ranges from 2 to 4.3 V with respect to its source. Therefore, the MOS transistors 31, 32, 38 and 39 are completely switched on, whereby they can supply a sufficient drive current to the LCD element.

With the voltage difference between VDD and VEE ranging from 2.5 to 6 V, the PMOS transistors 31a, 38 are not sufficiently switched on, but the gate voltages of the PMOS transistors 32 and 39 are in the range of from −4.17 to −3 V with respect to the sources thereof, whereby the PMOS transistors 32 and 39 are completely switched on to sufficiently drive the LCD element.

Figure 2:
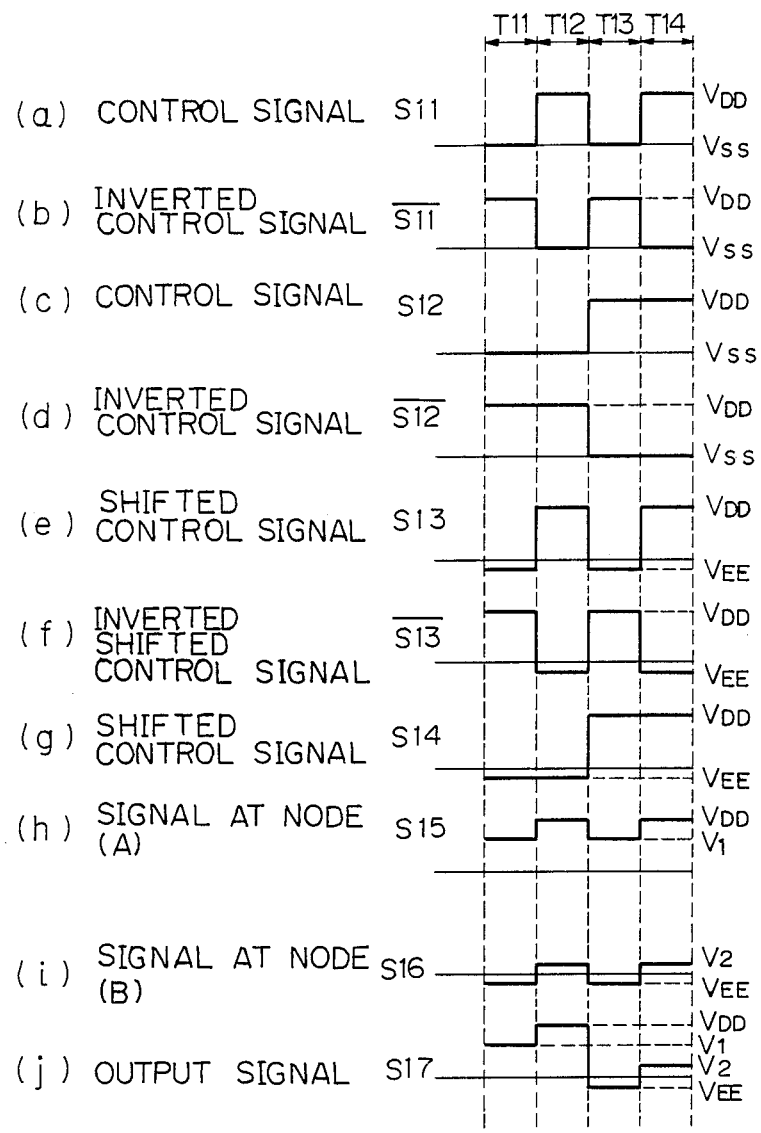
FIG. 2(a) through 2(j) respectively show signal waveforms of each portion of the circuit of the embodiment shown in FIG. 1.

Then, when the control signal S11 becomes an "H" level in the interval T12 of FIG. 2, the amplitude of the control signal S13 changes to VDD.

Hereby, the transfer switch 34 and the PMOS transistors 33, 35, 38, and 39 are switched on, while the transfer switch 31, the PMOS transistors 32, 37, and 41, and the NMOS transistors 36 and 40 are switched off.

Thus, the reference voltage VDD(+5 V) is supplied to the output terminal 28 (refer to FIG. 2(j)).

Hereupon, with the voltage difference between the reference voltages VDD and VEE ranging from 5 to 14 V, the voltage between the source and the gate of each of the PMOS transistors 38 and 39 drops, but the PMOS transistors 33, 38, 39, and 56 are switched on since a voltage difference between of gates of the PMOS transistors 33 and 39 is more than 4 V, and hence they can supply a sufficient drive current to the LCD element. Under this conditions, the PMOS transistor 56 may be neglected.

Moreover, with voltage difference between the reference voltages VDD and VEE being of from 2.5 to 5 V, the PMOS transistors 33 and 39 are completely switched on since the voltage between the source and the gate of each of the PMOS transistors 33 and 39 is 5 V, whereby they can sufficiently drive the LCD element.

In succession, when the control signals S11 and S12 are respectively to the "L" and "H" levels in the interval T13 of FIG. 2, the transfer switch 31, the PMOS transistors 32, 37, and 41, and the NMOS transistors 36 and 40 are switched on, while the transfer switch 34 and the PMOS transistors 33, 35, 38 and 39 are switched off.

Therefore, the reference voltage VEE (−1 V) is delivered to the output terminal (refer to FIG. 2(j)).

Thereupon, with the voltage difference between the reference voltages VDD and VEE ranging from 4.3 to 14 V, and with the voltage difference between the reference voltages VDD and VSS being 5 V, the PMOS transistors 37 and 41 are switched off, but the NMOS transistors 36 and 40 are adapted to have their gates higher than their sources by 4.3 through 14 V and hence can sufficiently drive the LCD element.

Furthermore, with the voltage difference between the reference voltages ranging from 2.5 to 4.3 V, the PMOS transistors 37 and 41 are adapted to have their gate voltages of from −2.5 to −0.7 V with respect to their sources, while the NMOS transistors 36 and 40 are adapted to have their gate voltages of from 2.5 to 4.3 v with respect to their sources and hence sufficiently switched on, whereby the LCD elements can be sufficiently driven.

Moreover, the MOS transistors 36 and 40 are connected in parallel to the MOS transistors 37 and 41. Since the former transistors have different bias characteristics from each other so as to prevent their on resistance from being increased, these transistors can supply a sufficient drive current to the LCD elements.

Then, when the control signals S11, S12 are changed together to the "H" level in the interval T14 of FIG. 2, the level shifting circuit 30 delivers the control signals S13 and S14 of the voltage VDD.

Hereby, the transfer switch 34, the PMOS transistors 56, 33, 35, and 41, and the NMOS transistor 40 are together switched on, while the transfer switch 31, the PMOS transistors 32, 37, 38 and 39, and the NMOS transistor 36 are together switched off.

Thus, the reference voltage V2 (+1 V) is delivered to the output terminal 28 (refer to FIG. 2(j)).

With the potential difference between the reference voltages VDD and VEE ranging from 6.45 to 14 V, the PMOS transistors 35, 41 are switched off, but the PMOS transistor 34a has its gate voltage ranging from −2.15 to −4.7 V with respect to its source and the NMOS transistors 34b and 40 have their gate voltages ranging from 4.3 to 9.3 V with respect to their sources. Accordingly, the P and N MOS transistors are connected in parallel to each other to permit their resistance components to be reduced, whereby they can sufficiently supply a drive current to the LCD elements.

Moreover, operating the CMOS output circuit with the potential difference between the reference voltages VDD and VEE ranging from 2.5 to 6.45 V, the gates of the P and N MOS transistors 34a, 34b, and 40 are insufficiently biased, but the voltage of the gates of the PMOS transistors 35 and 41 are of from −3.33 to −0.7 V with respect to their sources, and thus they can sufficiently drive the LCD element.

The input/output characteristics of the CMOS output circuit according to the present invention described above is as follows:

| Control Signal | | Output Signal Level |
|---|---|---|
| S11 | S12 | S17 |
| 0 (VSS) | 0 (VSS) | +3 V (V1) |
| 1 (VDD) | 0 (VSS) | +5 V (VDD) |
| 0 (VSS) | 1 (VDD) | −1 V (VEE) |
| 1 (VDD) | 1 (VDD) | +1 V (V2) |

It is obvious from this table that the CMOS output circuit can deliver 4-level waveform output signals with use of the 2-bit control signals S11 and S12 with sufficient current drive capability over a wide ranging operating voltage.

In the present embodiment, with the voltage difference between the LCD drive voltages VDD and VEE being low (2.5 to 10 V), the gate of the PMOS transistor 33 can have sufficient bias voltage supplied thereto and a sufficient supply current supplied thereto, and hence the PMOS transistor 33 may be removed.

According to the CMOS output circuit of the present invention, the gates of the MOS transistors can be sufficiently biased, whereby the LCD device can be operated over a wide-ranging drive voltage (2.5 to 5 V, 6 to 10 V, and 11 to 14 V, for example).

In addition, according to the present invention, with the switch means composed of the NMOS transistor being connected in parallel to the switch means composed of the PMOS transistor, a sufficient drive current can be supplied to the LCD segment even if a potential difference between VDD and VEE is low (2.5 to 4.0 V).

In case of the drive voltage lying in low voltage regions, the PMOS transistor is adapted to drive the LCD to enable all of the substrates of the N MOS transistors to be connected to VEE. Therefore, even with the potential difference between VDD and VEE is a high voltage (14 V, for example), a drain potential of the NMOS transistor is kept higher than that of the source, and hence a latch-up phenomenon can be prevented from being produced.

In a prior CMOS output circuit for driving an LCD, channel widths of the P and N MOS transistors had to respectively be, for example, about 300 μm and 130 μm, in order to increase the driving capability thereof. According to the present invention however, channel widths of the P and N MOS transistors can be reduced respectively to about 230 μm and about 80 μm.

Moreover, according to the output circuit of the present invention, although the number of P MOS transistors is increased, the total area of the IC chip can be reduced to about 16% of that of the prior art. This makes the IC device inexpensive.

Furthermore, a prior output circuit was operated with the potential difference between VDD and VEE substantially ranging from 4.5 to 13.5 V, while the output circuit of the present invention can be operated with a wide-ranging voltage difference of from about 2.5 to 14 V.

Describing below is a second embodiment of the CMOS output circuit for driving an LCD according to the present invention with reference to FIG. 5 in which a two-output type CMOS output circuit capable of supplying signal voltages to two LCD elements is shown.

Figure 5A:
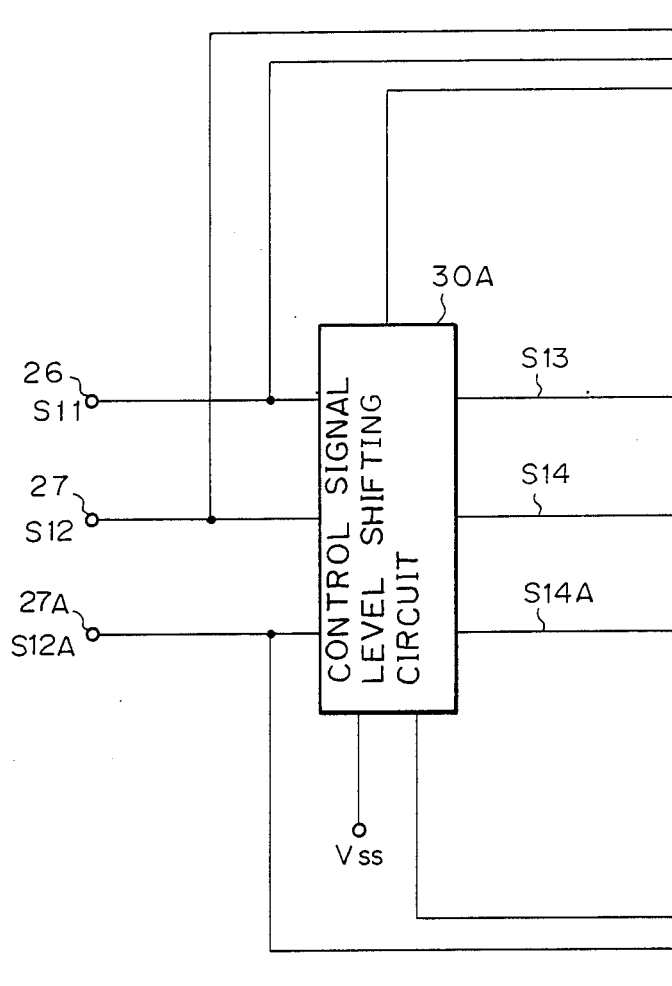
Figure 5B:
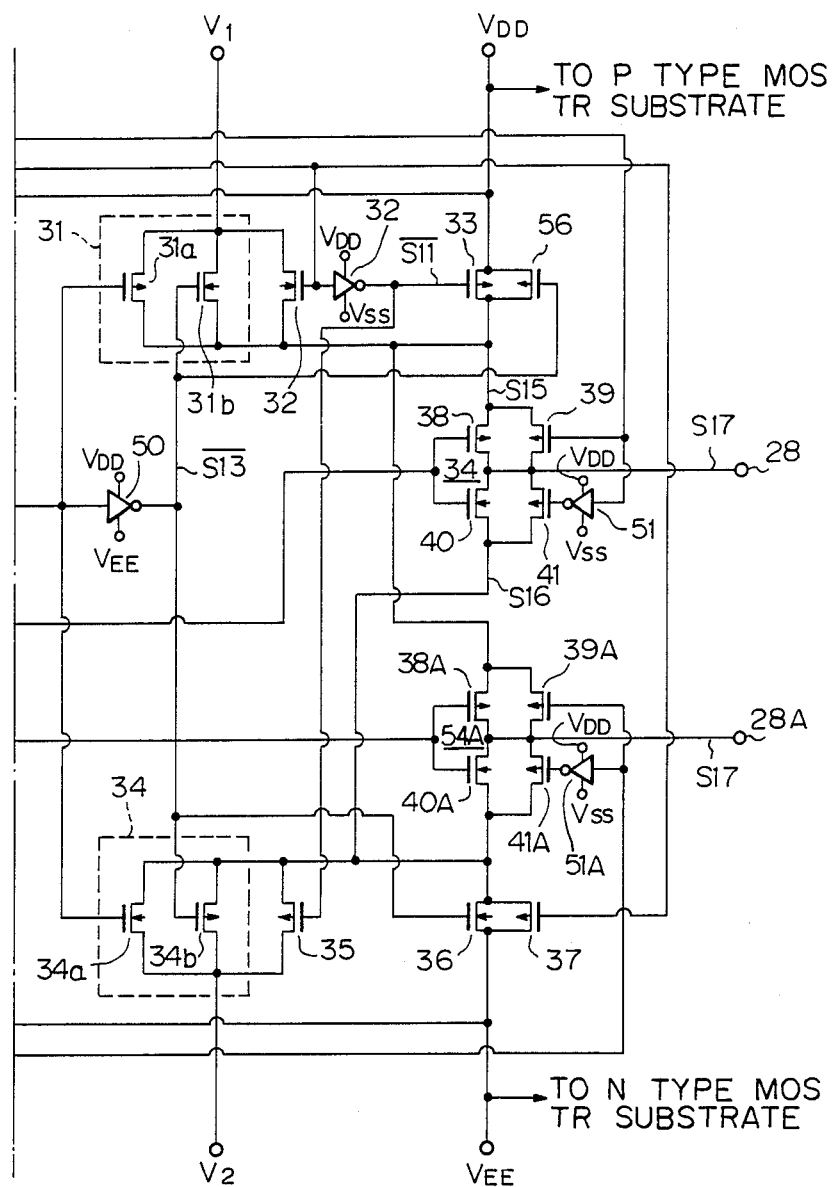

The CMOS output circuit of FIG. 5 additionally has the following circuit elements in addition to those shown in the embodiment of FIG. 1. Namely, a CMOS gate, P and N MOS transistors 39a, 41a, and an inverter 51A are additionally connected between the transfer gates 31 and 34.

In addition, the control signal level shifting circuit 30A is formed with three sets of voltage level converter means 58 (refer to FIG. 3), which provides control signals S13, S14, and S14A shifted by 3-bit control signals S11, S12, and S12A.

According to the second embodiment, the substrate for all of the PMOS transistors is connected to VDD (+5 V) while the substrate for all of the NMOS transistors is connected to VEE (−1 V).

The channel width of the MOS transistor and the drain current Id are proportional to each other as shown in the following approximate equation:

$$W = \frac{Id\ L}{K\ 2V_{ds}(V_{gs} - V_t) - V_{ds}^2}$$

where
L: channel length of the MOS transistor
K: constant
$V_{ds}$: drain-source voltage
$V_{gs}$: gate-source voltage, and
$V_t$: threshold voltage.

As evidenced from the equation, the transfer switches 31, 34 and the P and N MOS transistors 32, 33, 35, 36, and 37 must supply a current to the CMOS inverters 54, 54A, and 39, 41, 39A, and 41A, and hence they must have their channel widths doubled.

The output characteristics of the second embodiment of the drive circuit at the output terminals 28 and 28A thereof are provided, for example, as shown in the following table:

| Control Signal | | Output Signal Level | Control Signal | | Output Signal Level |
| --- | --- | --- | --- | --- | --- |
| S11 | S12 | S17 | S11 | S12A | S17A |
| 0 (VSS) | 0 (VSS) | +3 V (V1) | 0 (VSS) | 0 (VSS) | +3 V (V1) |
| 1 (VDD) | 0 (VDD) | +5 V (VDD) | 1 (VDD) | 0 (VDD) | +5 V (VDD) |
| 0 (VSS) | 1 (VSS) | −1 V (VEE) | 0 (VSS) | 1 (VEE) | −1 V (VEE) |
| 1 (VDD) | 1 (VDD) | +1 V (V2) | 1 (VDD) | 1 (V2) | +1 V (V2) |

The CMOS output circuit according to the present invention may be adapted to have 10 to 20 or more outputs by increasing the number of CMOS circuits and PMOS transistors between the transfer switches 31 and 34.

The CMOS output circuit of the present invention may preferablly be employed for driving LCD display devices for electronic game machines, electronic typewriters, word processors, and terminal units, etc.

Furthermore, the CMOS output circuit of the present invention may be embodied on a P type silicon substance.

What is claimed is:

1. A CMOS output circuit formed on a semiconductor substrate comprising:
   (a) a control signal level shifting circuit responsive to a plurality of external control signals for delivering a plurality of control signals respectively converted to different amplitude levels;
   (b) a first switch means responsive to one of said control signals from said control signal level shifting circuit for selectively delivering a first reference voltage;
   (c) a second switch means responsive to one of said control signals from said control signal level shifting circuit for delivering a second reference voltage;
   (d) a third switch means responsive to one of said control signals from said control signal level shifting circuit for delivering a third reference voltage;
   (e) a fourth switch means responsive to one of said control signals from said control signal level shifting circuit for selectively delivering a fourth reference voltage;
   (f) a fifth switch means for selectively delivering one of said first, second, third, and fourth reference voltages to an output terminal based on one of said control signals from said control signal level shifting circuit;
   (g) a sixth switch means, connected in parallel with said first switch means, responsive to one of said external control signals for selectively delivering said first reference voltage;
   (h) a seventh switch means, connected in parallel with said second switch means, responsive to one of said external control signals for selectively delivering said second reference voltage;
   (i) an eighth switch means, connected in parallel with said third switch means, responsive to one of said external control signals for selectively delivering said third reference voltages;
   (j) a ninth switch means, connected in parallel to said fourth switch means, responsive to one of said external control signals for selectively delivering said fourth reference voltage;
   (k) a tenth switch means, connected between output nodes of said first and third switch means, and said output terminal, responsive to one of said external control signals for delivering said first or third reference voltage to said output terminal; and
   (l) an eleventh switch means, connected between outputs of said second and fourth switch means, and said output terminal, responsive to one of said external control signals for delivering said second or fourth reference voltage to said output terminal.

2. A CMOS output circuit formed on a semiconductor substrate comprising:
   (a) a multi-power source circuit for generating first, second, third, and fourth reference voltages;
   (b) a control signal level shifting circuit for converting a plurality of external control signals to control signals shifted to different amplitude levels;
   (c) complementary MOS switch means connected between first and second signal input nodes and on-off controlled by one of said control signals from said control signal level shifting circuit for selectively delivering a reference voltage at said first or second signal input node to a signal output terminal;
   (d) a first MOS switch means, connected between said first reference voltage and said first signal input node of said complementary switch means for selectively delivering said first reference voltage to said first signal node based on one of said control signals from said control signal level shifting circuit;
   (e) a second MOS switch means, connected between said second reference voltage and said first signal input node of said complementary MOS switch for selectively delivering said second reference voltage to said first signal node based on one of said control signals from said control signal level shifting circuit;
   (f) a third MOS switch means connected between said third reference voltage and said second signal node of said complementary MOS switch means for selectively delivering said third reference voltage to said second signal node based on one of said control signals from said control signal level shifting circuit;
   (g) a fourth MOS switch means connected between said fourth reference voltage and said second signal node of said complementary MOS switch means for selectively delivering said fourth reference voltage to said second node based on one of said control signals from said control signal level shifting circuit;

(h) a fifth MOS switch means connected between said first reference voltage and said first signal input node for selectively delivering said first reference voltage to said first node based on one of said external control signals;

(i) a sixth MOS switch means connected between said third reference voltage and said second signal input node for selectively delivering said third reference voltage to said second node based on one of said external control signals;

(j) a seventh MOS switch means connected between said first signal input node and said signal output terminal for selectively delivering a reference voltage at said first signal input node to said output terminal based on one of said external control signals;

(k) an eighth MOS switch means connected between said second signal input node and said signal output terminal for selectively delivering a reference voltage at said second signal input node to said output terminal based on one of said external control signals; and (l) a ninth MOS switch means connected between said fourth reference voltage and said second signal input node for selectively delivering said fourth reference voltage to said second signal input node based on one of said external control signal.

3. A CMOS output circuit according to claim 2, wherein said first and third switch means respectively comprise CMOS inverters, and said fifth and ninth MOS switch means respectively comprise PMOS transistors.

4. A CMOS output circuit according to claim 2, further comprising a tenth MOS switch means connected between said second reference voltage and said first input node for selectively delivering said second reference voltage to said first input node based on one of said external signals.

5. A CMOS output circuit according to claim 3, wherein said semiconductor substrate constituting said PMOS transistor is connected to said second reference voltage.

6. A CMOS output circuit according to claim 2, wherein said first, second, third, and fourth reference voltages are respectively $+3$ V, $+5$ V, $+1$ V, and $-1$ V.

7. A CMOS output circuit according to claim 2, wherein said multi-power source circuit consists of a resistance divider circuit.

8. A CMOS output circuit according to claim 2, further comprising a second complementary MOS switch means connected between said first and second signal input nodes and controlled by one of said control signals from said control signal level shifting circuit.

9. A CMOS output circuit according to claim 2, wherein said control signal level shifting circuit comprises a plurality of voltage level converting circuits each of which has a first PMOS transistor having a gate electrode connected to one of said external control signals, a first electrode connected to a first power potential, and a second electrode; a second PMOS transistor having a gate electrode, a first electrode connected to said first power potential, and a second electrode; a first MOS inverter having an input connected to said gate of said first PMOS transistor, and an output connected to said gate electrode of said second PMOS transistor; a second MOS inverter having an input connected to said second electrode of said second PMOS transistor, and an output connected to said second electrode connected to said first PMOS transistor; and a third MOS inverter having an input connected to said output of said second inverter, and an output connected to said input of said second inverter; and first inverter being operated by said first power potential and a second power potential; said second and third inverters being operated by said first power potential and a third power potential.

* * * * *